(12) United States Patent
Nagata et al.

(10) Patent No.: US 7,541,646 B2
(45) Date of Patent: Jun. 2, 2009

(54) THIN FILM TRANSISTOR DEVICE AND METHOD OF MANUFACTURING THE SAME

(75) Inventors: Hitoshi Nagata, Tokyo (JP); Takao Sakamoto, Tokyo (JP); Naoki Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 23 days.

(21) Appl. No.: 11/673,773

(22) Filed: Feb. 12, 2007

(65) Prior Publication Data
US 2007/0210353 A1 Sep. 13, 2007

(30) Foreign Application Priority Data
Mar. 8, 2006 (JP) ............................. 2006-063368

(51) Int. Cl.
*H01L 21/84* (2006.01)
(52) U.S. Cl. ................ 257/347; 257/E21.561; 257/759; 257/760
(58) Field of Classification Search .......... 438/30, 438/151–166; 257/347, 759, 760, E21.561
See application file for complete search history.

(56) References Cited

U.S. PATENT DOCUMENTS

| 5,162,892 | A | 11/1992 | Hayashi et al. | |
|---|---|---|---|---|
| 6,150,692 | A | 11/2000 | Iwanaga et al. | |
| 6,277,678 | B1 * | 8/2001 | Lee | 438/151 |
| 2006/0186476 | A1 | 8/2006 | Suzuki | |

FOREIGN PATENT DOCUMENTS

| CN | 1445862 A | 10/2003 |
|---|---|---|
| CN | 1553518 A | 12/2004 |
| JP | 60-136259 | 7/1985 |
| JP | 61-46069 | 3/1986 |
| JP | 3-165066 | 7/1991 |
| JP | 6-260649 | 9/1994 |
| JP | 7-78997 | 3/1995 |

(Continued)

OTHER PUBLICATIONS

U.S. Appl. No. 11/673,773, filed Feb. 12, 2007, Nagata et al.

(Continued)

*Primary Examiner*—Richard A. Booth
(74) *Attorney, Agent, or Firm*—Oblon, Spivak, McClelland, Maier & Neustadt, P.C.

(57) ABSTRACT

A thin film transistor device according to an embodiment of the invention includes: a thin film transistor having a silicon layer including a source region, a drain region, and a channel region, a gate insulating layer, and a gate electrode formed on an insulating substrate; an interlayer insulating layer covering the thin film transistor; a line electrically connected with the source region, the drain region, and the gate electrode through a contact hole formed in the interlayer insulating layer; a first upper insulating layer covering the line and the interlayer insulating layer and smoothing out stepped portions of the line and irregularities of a surface of the interlayer insulating layer; and a second upper insulating layer covering the first upper insulating layer, the second upper insulating layer having a hydrogen diffusion coefficient smaller than a hydrogen diffusion coefficient of the first upper insulating layer.

7 Claims, 3 Drawing Sheets

FOREIGN PATENT DOCUMENTS

| | | |
|---|---|---|
| JP | 2508601 | 4/1996 |
| JP | 10-41518 | 2/1998 |
| JP | 11-46000 | 2/1999 |
| JP | 2000-332258 | 11/2000 |

OTHER PUBLICATIONS

U.S. Appl. No. 11/758,925, filed Jun. 6, 2007, Nagata et al.
U.S. Appl. No. 11/778,382, filed Jul. 16, 2007, Nagata et al.
U.S. Appl. No. 11/830,474, filed Jul. 30, 2007, Nagata et al.

* cited by examiner

THIN FILM TRANSISTOR DEVICE AND METHOD OF MANUFACTURING THE SAME

BACKGROUND OF THE INVENTION

1. Field of the Invention

The present invention relates to a thin film transistor device and a method of manufacturing the same.

2. Description of Related Art

Along with recent full-fledged developments in advanced information society or rapid popularization of a multimedia system, a high priority has been put on liquid crystal display devices or organic Electro Luminescence (EL) display devices. As pixels of such display devices or peripheral circuit driving transistors, thin film transistors (TFTs) have been widely used.

The TFTs have been roughly classified into two types, an amorphous silicon TFT and a polycrystalline silicon TFT. The polycrystalline silicon has carrier mobility about two digits higher than that of the amorphous silicon. Hence, a TFT performance can be improved. On the other hand, the polycrystalline silicon should be manufactured at as high temperature as about 1000° C., and a quartz glass substrate, not glass substrate, needs to be used as an insulating substrate. Thus, its drawback is a manufacturing cost. However, developments of low-temperature process bring about low-temperature polycrystalline silicon TFTs that overcome the above problem, and contribute to the manufacture of large-size or high-definition display devices.

In general, the low-temperature polycrystalline silicon TFT is manufactured by forming a silicon layer including a source region, a drain region, and a channel region on an insulating substrate, forming a gate insulating layer on the silicon layer, and forming a gate electrode on the gate insulating layer. Further, formed on the gate electrode is an interlayer insulating layer covering the gate electrode and the gate insulating layer. A line connected with a source region, a drain region, and a gate electrode through a contact hole passed through the interlayer insulating layer and its underlying gate insulating layer. In addition, an upper insulating layer covering the line and the interlayer insulating layer is formed on the line.

A typical example of the aforementioned insulating substrate is glass. Under this constraint, the low-temperature polycrystalline silicon TFT needs to be formed at a temperature not higher than about 600° C. as a strain point of glass. However, such low-temperature process tends to cause dangling bonds as defects in silicon bonding inside the silicon layer or at an interface between the silicon layer and the gate insulating layer or the insulating substrate. As disclosed in Japanese Unexamined Patent Publication Nos. 60-136259, 61-46069, and 7-78997, if higher-temperature heat treatment, so-called hydrogenation, is carried out under such condition that a film suppressing diffusion of hydrogen is formed as an upper layer, the dangling bonds are eliminated by being bound to hydrogen atoms in the films forming the TFT.

The aforementioned upper insulating layer also functions as the film suppressing the diffusion of hydrogen. Therefore, as the upper insulating layer, a silicon nitride film or the like formed by plasma Chemical Vapor Deposition (CVD) is used. Here, the plasma CVD film covers stepped portions of lines and irregularities on the surface of the interlayer insulating layer, so a fissure or coverage failure tends to occur at these stepped portions and uneven portions due to concentrated stress. If the fissure or coverage failure occurs, hydrogen disperses therefrom upon heat treatment, with the result that the hydrogen concentration around the fissure or coverage failure locally drops. This leads to a problem in that the dangling bond density becomes nonuniform in the thin film transistor structure after the heat treatment, and a threshold voltage, carrier mobility, or other such performances of the thin film transistor vary.

SUMMARY OF THE INVENTION

The present invention has been accomplished with a view to solving the aforementioned problem, and aims at providing a thin film transistor device and a method of manufacturing the same capable of suppressing variations in performance of a thin film transistor.

A thin film transistor device according to an aspect of the present invention includes: a thin film transistor having a silicon layer including a source region, a drain region, and a channel region, a gate insulating layer, and a gate electrode formed on an insulating substrate; an interlayer insulating layer covering the thin film transistor; a line electrically connected with the source region, the drain region, and the gate electrode through a contact hole formed in the interlayer insulating layer; a first upper insulating layer covering the line and the interlayer insulating layer and smoothing out stepped portions of the line and irregularities of a surface of the interlayer insulating layer; and a second upper insulating layer covering the first upper insulating layer, the second upper insulating layer having a hydrogen diffusion coefficient smaller than a hydrogen diffusion coefficient of the first upper insulating layer.

A method of manufacturing a thin film transistor device according to another aspect of the invention includes: forming the thin film transistor having a silicon layer including a source region, a drain region, and a channel region, a gate insulating layer, and a gate electrode on an insulating substrate; forming an interlayer insulating layer on the thin film transistor; forming a contact hole in the interlayer insulating layer and forming a line connected with the source region, the drain region, and the gate electrode through the contact hole; forming a first upper insulating layer on the line and the interlayer insulating layer and executing planarization to smooth out stepped portions of the line and irregularities of a surface of the interlayer insulating layer; and forming a second upper insulating layer on the first upper insulating layer, the second upper insulating layer having a hydrogen diffusion coefficient smaller than a hydrogen diffusion coefficient of the first upper insulating layer.

A thin film transistor device according to another aspect of the invention includes: a thin film transistor having a silicon layer including a source region, a drain region, and a channel region, a gate insulating layer, and a gate electrode formed on an insulating substrate; a first interlayer insulating layer covering the thin film transistor and smoothing out irregularities of a surface of the thin film transistor; and a second interlayer insulating layer covering the first interlayer insulating layer, the second interlayer insulating layer having a hydrogen diffusion coefficient smaller than a hydrogen diffusion coefficient of the first interlayer insulating layer.

A method of manufacturing a thin film transistor device according to another aspect of the invention includes: forming the thin film transistor having a silicon layer including a source region, a drain region, and a channel region, a gate insulating layer, and a gate electrode on an insulating substrate; forming a first interlayer insulating layer on the thin film transistor, and executing planarization to smooth out irregularities of a surface of the thin film transistor; and forming a second interlayer insulating layer on the first interlayer insulating layer, the second interlayer insulating layer having a hydrogen diffusion coefficient smaller than a hydrogen diffusion coefficient of the first interlayer insulating layer.

According to the present invention, it is possible to provide a thin film transistor device and a method of manufacturing the same capable of suppressing variations in performance of a thin film transistor.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

The present invention will be now described herein with reference to illustrative embodiments. Those skilled in the art will recognize that the invention is not limited to these embodiments. For ease of explanation, the following description and the accompanying drawings are given in an abbreviated and simplified manner as appropriate.

First Embodiment

Figure 1A:
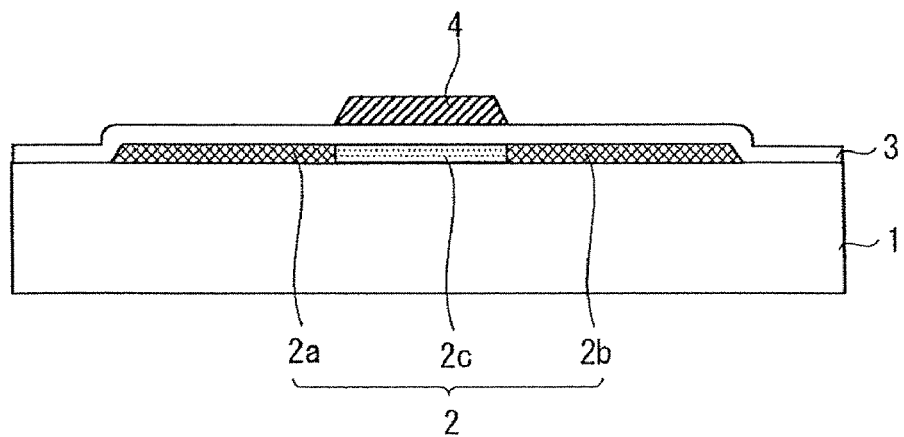
FIGS. 1A to 1C are sectional views showing a manufacturing process of a thin film transistor device and a method of manufacturing the same according to a first embodiment of the present invention.
Figure 1B:
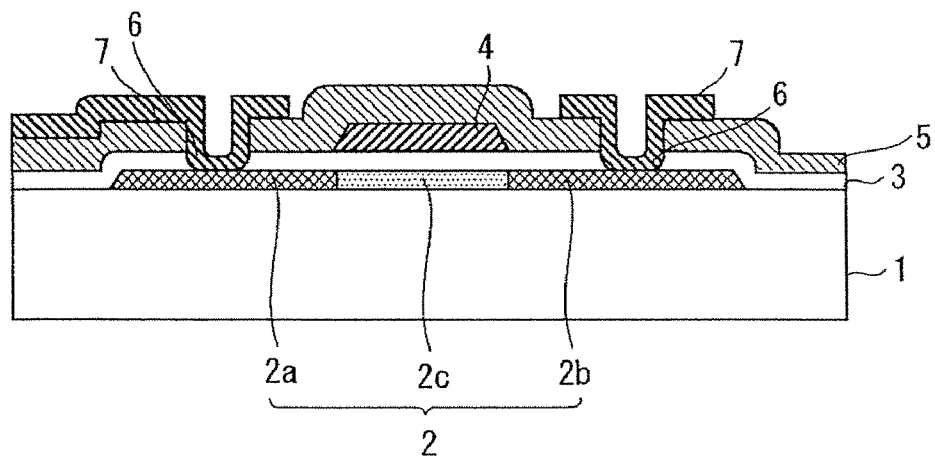
Figure 1C:
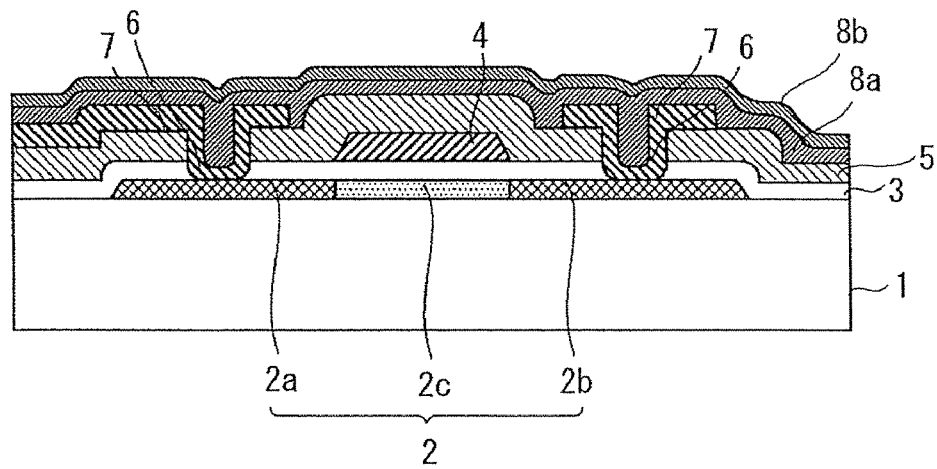

Referring to FIGS. 1A to 1C, a thin film transistor device and a method of manufacturing the same according to a first embodiment of the present invention are described. FIG. 1C is a sectional view of a thin film transistor device of the first embodiment. A thin film transistor of the first embodiment can be used for an active matrix type display device such as a liquid crystal display device or an organic EL display device.

As shown in FIG. 1C, the thin film transistor device of the first embodiment includes an insulating substrate 1, a silicon layer 2, a gate insulating layer 3, a gate electrode 4, an interlayer insulating layer 5, a contact hole 6, a line 7, a first upper insulating layer 8a, and a second upper insulating layer 8b.

A typical example of the insulating substrate 1 is a glass substrate. In addition, a quartz glass substrate and a substrate having one or more protective insulating layers formed on the glass or quartz glass substrate may be used as well. Further, a substrate having one or more protective insulating layers formed on a metal substrate can be used.

A silicon layer 2 including a source region 2a, a drain region 2b, and a channel region 2c is formed on an insulating substrate 1. For minimizing a height difference between the insulating substrate 1 and the silicon layer 2, the silicon film 2 is desirably tapered on both sides. As the silicon layer 2, an amorphous silicon as well as a polycrystalline silicon can be used.

The gate insulating layer 3 is formed on the silicon layer 2. The gate insulating layer 3 is required not to cause a trap level of electrons or holes at an interface with the silicon layer 2. Further, in order to eliminate as many dangling bonds as possible upon so-called hydrogenation, it is desirable that the gate insulating layer 3 contain many hydrogen atoms. More specifically, a silicon oxide film formed by a CVD process or a film formed by thermally-oxidizing the silicon layer 2 can be used.

A gate electrode 4 is formed on the gate insulating layer 3. For minimizing a height difference between the gate insulating layer 3 and its overlying gate electrode 4, the gate electrode 4 is desirably tapered on both sides. The gate electrode 4 needs to have, of course, a low resistance. To that end, Al, Cu, Mo, Cr, Ta, Ti, or the like is applicable as the gate electrode 4. Further, if the gate electrode 4 can suppress diffusion of hydrogen, it is possible to prevent hydrogen from diffusing from the gate electrode 4 upon so-called hydrogenation, so the dangling bonds can be effectively eliminated. Hence, the gate electrode 4 is desirably a multi-layer film having at least one of barrier metal TiN, TaN, MoN, NbN, WN, VN, ZrN, and HfN films having a hydrogen diffusion coefficient smaller than that of the gate insulating layer 3.

The interlayer insulating layer 5 covering the gate electrode 4 and the gate insulating layer 3 is formed on the gate electrode 4. The interlayer insulating layer 5 needs to be electrically insulated from the overlying line 7 and to reduce parasitic capacitance between the line 7 and the gate electrode 4. In addition, the interlayer insulating layer 5 is expected to supply hydrogen upon so-called hydrogenation. Accordingly, as the interlayer insulating layer 5, a silicon oxide film having a high hydrogen content is desirably used.

The line 7 connected with the source region 2a, the drain region 2b, and the gate electrode 4 through the contact hole 6 passed through the interlayer insulating layer 5 and its underlying gate insulating layer 3 is formed. Conceivable examples of a material for the line 7 are Al, Cu, Me, Cr, Ta, and Ti. For the same reason as the gate electrode 4, the line 7 is desirably a multi-layer film including at least one of barrier metal TiN, TaN, MoN, NbN, WN, VN, ZrN, HfN films effective for suppressing diffusion of hydrogen.

A first upper insulating layer 8a is formed on the line 7 and the interlayer insulating layer 5. The first upper insulating layer 8a serves to smooth out irregularities on the surfaces of the line 7 and the interlayer insulating layer 5, that is, to lower the gradient of irregularities on the surfaces of the line 7 and the interlayer insulating layer 5, and serves to eliminate a fissure or coverage failure of a second upper insulating layer 8b formed on the first upper insulating layer 8a surface. In this example, the gradient of the surface irregularities is determined based on a main surface of the insulating substrate 1. The term "lower the gradient" means that the gradient of the surface irregularities of the first upper insulating layer 8a is smaller than that of corresponding portions of the line 7 and the interlayer insulating layer 5. From another point of view, the surface of the first upper insulating layer 8a is planarized so that the gradient of the surface irregularities is at least 90 degrees or less, preferably, 45 degrees or less. The first upper insulating layer 8a may be either a single-layer film or a multi-layer film as long as having a function of lowering the gradient of the surface irregularities of the line 7 and the interlayer insulating layer 5. Further, the first upper insulating layer 8a is expected to supply hydrogen upon so-called hydrogenation. Hence, a silicon oxide film having a high hydrogen content is desirable as the first upper insulating layer 8a.

The second upper insulating layer 8b is formed on the first upper insulating layer 8a. The second upper insulating layer 8b needs to have an effect of suppressing diffusion of hydrogen. Hence, a silicon nitride film or a silicon oxynitride film is desirable as the second upper insulating layer 8b. Incidentally, the second upper insulating layer 8b may be either a single-layer film or a multi-layer film as long as having an effect of suppressing diffusion of hydrogen.

Referring next to FIGS. 1A to 1C, a method of manufacturing the thin film transistor device of the first embodiment is described. FIGS. 1A to 1C are sectional views of a thin film transistor device in each step of a manufacturing process. As shown in FIG. 1A, the silicon layer 2 is deposited on the insulating substrate 1 by low-pressure CVD or plasma CVD. At this time, the silicon layer 2 is amorphous and thus is polycrystallized by laser annealing or thermal annealing. If necessary, dehydrogenation is carried out prior to the annealing process. The gate insulating layer 3 as a silicon oxide film is formed on the silicon layer 2 by CVD or thermal oxidation. The gate electrode 4 is formed on the gate insulating layer 3 by metal sputtering of Al, Me, or the like. As discussed above, the gate electrode 4 is desirably a multi-layer film having at least one of barrier metal TiN, TaN, and MoN films having a hydrogen diffusion coefficient smaller than that of the gate insulating layer 3.

As shown in FIG. 1B, the interlayer insulating layer 5 as a silicon oxide film or the like is formed on the gate electrode 4 and the gate insulating layer 3 by plasma CVD. After the contact hole 6 is formed to pass through the interlayer insulating layer 5 and its underlying gate insulating layer 3, the line 7 is formed by metal sputtering of Al, Mo, or the like. As discussed above, the line 7 is desirably a multi-layer film having at least one of barrier metal TiN, TaN, and MoN films capable of suppressing diffusion of hydrogen.

As shown in FIG. 1C, the first upper insulating layer 8a is formed on the line 7 and the interlayer insulating layer 5. The first upper insulating layer 8a is desirably a silicon oxide film having a high hydrogen content which is expected to supply hydrogen upon so-called hydrogenation. The first upper insulating layer 8a can be formed by spin-coating or slit-coating. The coating is especially effective for smoothing out the surface irregularities of the interlayer insulating layer 5 or stepped portions of the line 7. Four typical coating methods are given below.

A first method is such that a low-temperature CVD film is formed by plasma CVD or the like and then, its surface is coated with an organic SOD or organic SOG film and planarized, and the planarized surface is transferred to the CVD film by etchback. As the CVD film, a CVD silicon oxide film that is formed using Tetra Ethoxy Ortho Silicate (TEOS) as a material gas is preferably used.

A second method is such that a target film is coated with the organic SOD or organic SOG film and used without being etched back. A desirable material for the organic SOD or organic SOG film is Methyl-SilsesQuioxane (MSQ) Examples of the MSQ-based material include OCDT-9, OCDT-39 (TOKYO OHKA KOGYO CO., LTD.) and HSG-R7, HSG-RZ25 (Hitachi Chemical Co., Ltd.).

A third method is such that a target film is coated with an inorganic SOD or inorganic SOG film. A desirable material for the inorganic SOD or inorganic SOG film is Hydrogen Silses Quioxane (HSQ) . Exampled of the HSQ-based material include FOx-12 to FOx-15 (Dow Corning Corporation) and OCDT-12, OCDT-32 (TOKYO OHKA KOGYO CO., LTD.).

A fourth method is such that a target film is coated with a high-heat-resistance organic resin resistant to 400° C. or higher, which can withstand so-called hydrogenation in a subsequent step. Examples of the high-heat-resistance organic resin material include SiLK (Dow Chemical Company) and FLARE (Honeywell Electronics Materials Company).

The second upper insulating layer 8b as a silicon nitride film or silicon oxynitride film is formed on the first upper insulating layer 8a by plasma CVD. The second upper insulating layer 8b is formed on the flat surface of the first upper insulating layer 8a and thus involves neither fissure nor coverage failure. Further, the second upper insulating layer 8b has a hydrogen diffusion coefficient smaller than that of the first upper insulating layer 8a, it is possible to effectively suppress diffusion of hydrogen in an underlying film from the TFT structure upon so-called hydrogenation, and dangling bonds inside the silicon layer 2 and at interfaces between the silicon layer 2 and the gate insulating layer 3 and between the silicon layer 2 and the insulating substrate 1 can be more uniformly and effectively eliminated than conventional techniques. The hydrogenation can be carried out at 200° C. to 600°C., preferably at 350° C. to 500° C. This is because hydrogen cannot well diffuse at 200° C. or lower, and the strain point of glass is about 600° C.

Second Embodiment

Figure 2A:
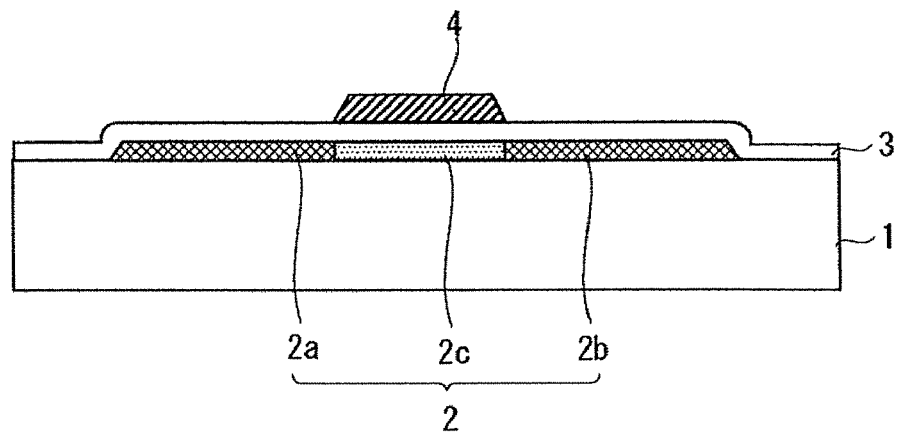
FIGS. 2A to 2C are sectional views showing a manufacturing process of a thin film transistor device and a method of manufacturing the same according to a second embodiment of the present invention.
Figure 2B:
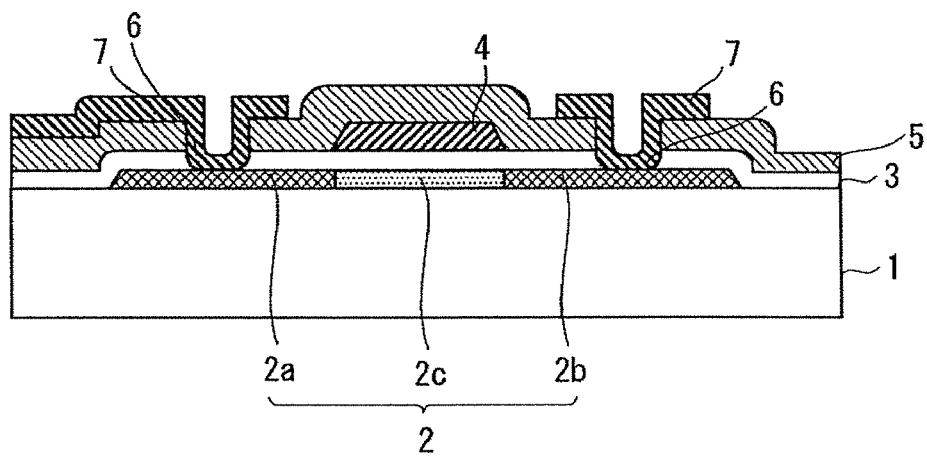
Figure 2C:
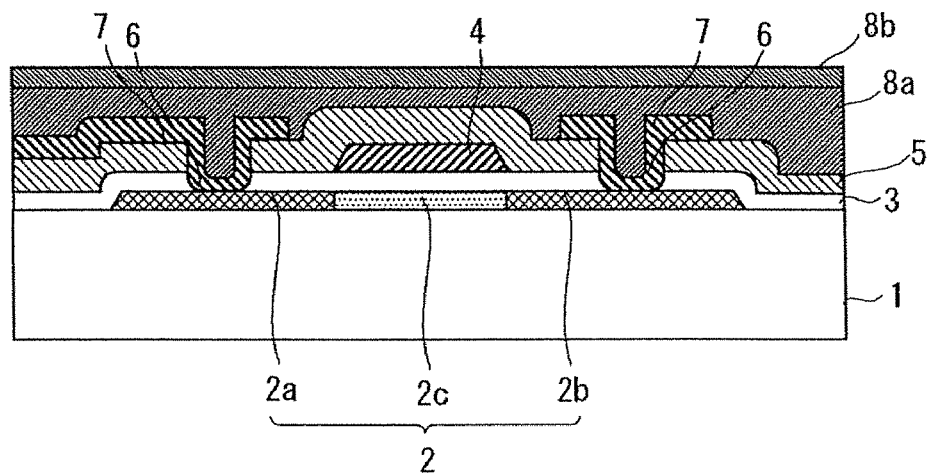

Referring to FIGS. 2A to 2C, a thin film transistor device and a method of manufacturing the same according to a second embodiment of the present invention are described. FIG. 2C is a sectional view of the thin film transistor device of the second embodiment. In FIGS. 2A to 2C, the same components as those of FIGS. 1A to 1C are denoted by identical reference numerals. The components of FIGS. 2A to 2C are the same as those of FIGS. 1A to 1C, so description about its structure is omitted here. The second embodiment differs from the first embodiment in that the entire surface of the first upper insulating layer 8a and the second upper insulating layer 8b is made flat and smooth in parallel to the insulating substrate 1. A thin film transistor of the second embodiment can be also used for an active matrix type display device such as a liquid crystal display device or an organic EL display device.

FIGS. 2A to 2C are process charts of a method of manufacturing the thin film transistor device of the second embodiment or sectional views of the thin film transistor device in each step of a manufacturing process. Steps up to the formation of the line 7 are the same as those of the first embodiment. Hence, the steps of FIGS. 2A and 2B are the same as those of FIGS. 1A and 1B, and description thereof is omitted here.

As shown in FIG. 2C, the first upper insulating layer 8a is formed on the line 7 by low-temperature CVD such as plasma CVD. The first upper insulating layer 8a is a silicon oxide film having a high hydrogen content, which is expected to supply hydrogen upon so-called hydrogenation. Needless to say, the first upper insulating layer 8a may be formed in a manner similar to the first embodiment. Thus, a MSQ-based organic film or HSQ-based inorganic film can be also used as the first upper insulating layer 8a.

The entire surface of the first upper insulating layer 8a is made flat and smooth in parallel to the insulating substrate 1 by Chemical Mechanical Polishing (CMP). Upon the CMP, it is considered whether or not a slurry optimum for a material of the first upper insulating layer 8a is selected. The entire surface of the first upper insulating layer 8a is made flat and smooth with respect to irregularities of the interlayer insulating layer 5 and stepped portions of the line 7, and thus the surface of the second upper insulating layer 8b that overlies the first upper insulating layer 8a can be made flat and smooth.

If the thin film transistor device according to the present invention is applied to an active matrix type display device, it is very important to make the surface of the second upper insulating layer 8b flat and smooth for obtaining the flat and smooth surface of the pixel electrode formed on the second upper insulating layer 8b. Hence, surface roughness of the first upper insulating layer 8a is desirably 50 nm or less in terms of Root Mean Square (RMS) value in a 100 μm$^2$ area. Incidentally, the surface of the second upper insulating layer 8b can be also made flat and smooth by CMP of the second upper insulating layer 8b. At this time, the first upper insulating layer 8a may be a film as shown in FIGS. 1A to 1C.

The second upper insulating layer 8b as a silicon nitride film or silicon oxynitride film is formed on the first upper insulating layer 8a by plasma CVD. The second upper insulating layer 8b is formed on the flat surface of the first upper insulating layer 8a and thus involves neither fissure nor coverage failure. Further, the second upper insulating layer 8b has a hydrogen diffusion coefficient smaller than that of the first upper insulating layer 8a, it is possible to effectively suppress diffusion of hydrogen in an underlying film from the TFT structure upon so-called hydrogenation, and dangling bonds inside the silicon layer 2 and at interfaces between the silicon layer 2 and the gate insulating layer 3 and between the silicon layer 2 and the insulating substrate 1 can be more uniformly and effectively eliminated than conventional techniques. The hydrogenation can be carried out at 200° C. to 600° C., preferably at 350° C. to 500° C. This is because hydrogen cannot well diffuse at 200° C. or lower, and the strain point of glass is about 600° C.

Third Embodiment

Figure 3A:
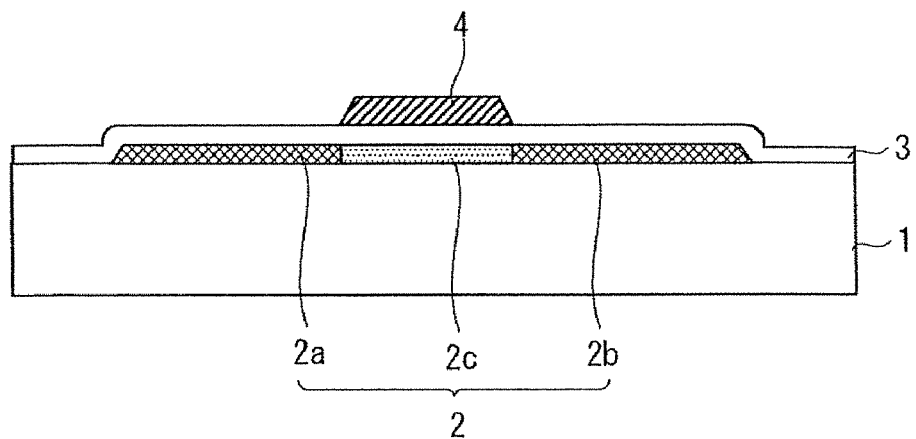
FIGS. 3A to 3C are sectional views showing a manufacturing process of a thin film transistor device and a method of manufacturing the same according to a third embodiment of the present invention.
Figure 3B:
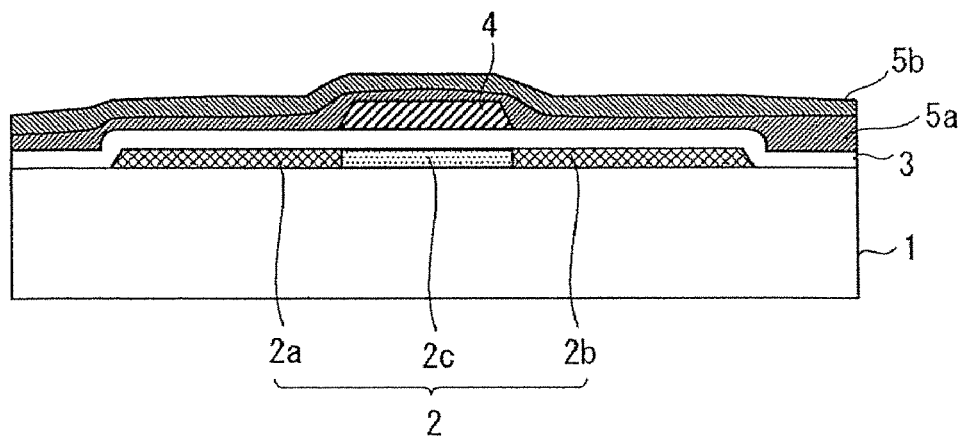
Figure 3C:
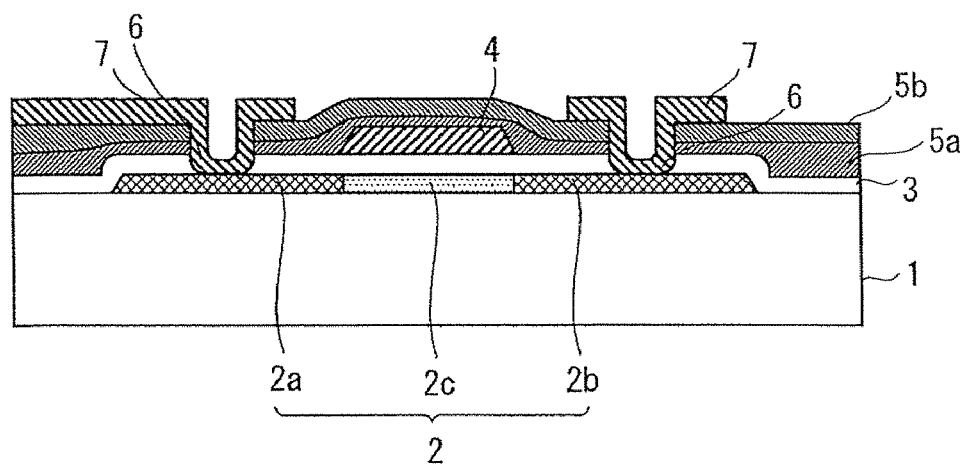

Referring to FIGS. 3A to 3C, a thin film transistor device and a method of manufacturing the same according to a third embodiment of the present invention are described. FIG. 3C is a sectional view of the thin film transistor device of this embodiment. In FIGS. 3A to 3C, the same components as those of FIGS. 1A to 1C are denoted by identical reference numerals, so description thereof is omitted here. This embodiment differs from the first and second embodiments in that the function of the upper insulating layer on the line in the first and second embodiments is realized by the interlayer insulating layer in the third embodiment. That is, as shown in FIG. 3C, the thin film transistor device of the third embodiment includes the first interlayer insulating layer 5a and the second interlayer insulating layer 5b in place of the interlayer insulating layer 5 of FIGS. 1A to 1C and FIGS. 2A to 2C. A thin film transistor of the third embodiment can be also used for an active matrix type display device such as a liquid crystal display device or an organic EL display device.

The first interlayer insulating layer 5a is formed on the gate electrode 4 and the gate insulating layer 3. The first upper insulating layer 5a lowers the gradient of the surface irregularities of the gate electrode 4 and the gate insulating layer 3, and serves to eliminate a fissure or coverage failure of the second interlayer insulating layer 5b formed on the first interlayer insulating layer 5a. Here, the gradient of the surface irregularities is determined based on the main surface of the insulating substrate 1. Further, The term "lower the gradient" means that the gradient of the surface irregularities of the first interlayer insulating layer 5a is smaller than that of corresponding portions of the gate electrode 4 and the gate insulating layer 3. Incidentally, the first interlayer insulating layer 5a may be either a single-layer film or a multi-layer film as long as it can lower the gradient of the surface irregularities of the gate electrode 4 and the gate insulating layer 3. Further, the first interlayer insulating layer 5a is expected to supply hydrogen upon so-called hydrogenation. Hence, a silicon oxide film having a high hydrogen content is desirable as the first interlayer insulating layer 5a.

The second interlayer insulating layer 5b is formed on the first interlayer insulating layer 5a. The second interlayer insulating layer 5b needs to have an effect of suppressing diffusion of hydrogen. Hence, as the second interlayer insulating layer 5b, a silicon nitride film or silicon oxynitride film having a hydrogen diffusion coefficient smaller than that of the first interlayer insulating layer 5a is desirable. Incidentally, the second interlayer insulating layer 5b may be either a single-layer film or a multi-layer film as long as having the effect of suppressing diffusion of hydrogen.

FIGS. 3A to 3C are process charts of the method of manufacturing the thin film transistor device of the third embodiment or sectional views of the thin film transistor device in each step of a manufacturing process. Steps up to the formation of the gate electrode 4 in FIG. 3A are the same as those of FIG. 1A and FIG. 2A, so description thereof is omitted here. As shown in FIG. 3B, the first interlayer insulating layer 5a is next formed on the substrate where the gate electrode 4 has been formed. The first interlayer insulating layer 5a is desirably planarized by the following four methods.

A first method is such that a low-temperature CVD film is formed by plasma CVD or the like and then, its surface is coated with an organic SOD or organic SOG film and planarized, and the planarized surface is transferred to the CVD film by etchback. As the CVD film, a CVD silicon oxide film that is formed using TEOS as a material gas is preferably used.

A second method is such that a target film is coated with the organic SOD or organic SOG film and used without being etched back. A desirable material for the organic SOD or organic SOG film is Methyl-SilsesQuioxane (MSQ). Examples of the MSQ-based material include OCDT-9, OCDT-39 (TOKYO OHKA KOGYO CO., LTD.) and HSG-R7, HSG-RZ25 (Hitachi Chemical Co., Ltd.).

A third method is such that a target film is coated with an inorganic SOD or inorganic SOG film. A desirable material for the inorganic SOD or inorganic SOG film is Hydrogen SilsesQuioxane (HSQ). Examples of the HSQ-based material include FOx-12 to FOx-15 (Dow Corning Corporation) and OCDT-12, OCDT-32 (TOKYO OHKA KOGYO CO., LTD.).

A fourth method is such that a target film is coated with a high-heat-resistance organic resin resistant to 400° C. or higher, which can withstand so-called hydrogenation in a subsequent step. Examples of the high-heat-resistance organic resin material include SiLK (Dow Chemical Company) and FLARE (Honeywell Electronics Materials Company).

The second interlayer insulating layer 5b as a silicon nitride film or silicon oxynitride film is formed on the first interlayer insulating layer 5a by plasma CVD. The second interlayer insulating layer 5b is formed on the flat surface of the first interlayer insulating layer 5a and thus involves neither fissure nor coverage failure. Further, the second interlayer insulating layer 5b has a hydrogen diffusion coefficient smaller than that of the first interlayer insulating layer 5a, it is possible to effectively suppress diffusion of hydrogen in an underlying film from the TFT structure during heat treatment prior to the formation of the contact hole 6, and to uniformly eliminate dangling bonds inside the silicon layer 2 and at interfaces between the silicon layer 2 and the gate insulating layer 3 and between the silicon layer 2 and the insulating substrate 1.

As shown in FIG. 3C, after the formation of the contact hole 6 passed through the first interlayer insulating layer 5a, the second interlayer insulating layer 5b, and the underlying gate insulating layer 3, the line 7 is formed using a multi-layer film including at least one of TiN, TaN, MoN, NbN, WN, VN, ZrN, and HfN films by sputtering. Since the line 7 has a function of suppressing diffusion of hydrogen, and the second interlayer insulating layer 5b suppressing the diffusion of hydrogen has neither fissure nor coverage failure, it is possible to effectively suppress diffusion of hydrogen in an underlying film from the TFT structure upon so-called hydrogenation. Thus, dangling bonds inside the silicon layer 2 and at interfaces between the silicon layer 2 and the gate insulating layer 3 and between the silicon layer 2 and the insulating substrate 1 can be more uniformly and effectively eliminated than conventional techniques. The hydrogenation can be carried out at 200° C. to 600° C., preferably at 350° C. to 500° C. This is because hydrogen cannot well diffuse at 200° C. or lower, and the strain point of glass is about 600° C.

Incidentally, in the third embodiment, the first interlayer insulating layer 5a as a silicon oxide film, a silicon nitride film, a silicon oxynitride film, or a laminate film thereof formed by low-temperature CVD such as plasma CVD can be planarized by CMP. The above first to third embodiments describe the structure including coplanar TFTs, but the structure including forward and inversely staggered TFTs can attain similar beneficial effects.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A thin film transistor device, comprising:
    a thin film transistor having a silicon layer including a source region, a drain region, and a channel region, a gate insulating layer, and a gate electrode formed on an insulating substrate;
    an interlayer insulating layer covering the thin film transistor;
    a line electrically connected with the source region, the drain region, and the gate electrode through a contact hole formed in the interlayer insulating layer;
    a first upper insulating layer covering the line and the interlayer insulating layer directly and smoothing out stepped portions of the line and irregularities of a surface of the interlayer insulating layer; and
    a second upper insulating layer covering the first upper insulating layer,
    the second upper insulating layer having a hydrogen diffusion coefficient smaller than a hydrogen diffusion coefficient of the first upper insulating layer;
    wherein the first upper insulating layer is a single layer comprising one of an organic Spin On Dielectrics (SOD) film, an organic Spin On Glass (SOG) film, an inorganic SOD film, an inorganic SOG film, and a high-heat-resistance organic polymer film resistant to a temperature of about 400° C. or higher.

2. The thin film transistor device according to claim 1, wherein surface roughness of the first upper insulating layer is 50 nm or less in terms of a RMS value in a 100 µm² area.

3. The thin film transistor device according to claim 1, wherein the second upper insulating layer includes a silicon nitride film layer or a silicon oxynitride film layer.

4. An active matrix type display device comprising the thin film transistor device according to claim 1.

5. A thin film transistor device, comprising:
    a thin film transistor having a silicon layer including a source region, a drain region, and a channel region, a gate insulating layer, and a gate electrode formed on an insulating substrate;
    a first interlayer insulating layer covering the thin film transistor directly and smoothing out irregularities of a surface of the thin film transistor; and
    a second interlayer insulating layer covering the first interlayer insulating layer,
    the second interlayer insulating layer having a hydrogen diffusion coefficient smaller than a hydrogen diffusion coefficient of the first interlayer insulating layer;
    wherein the first interlayer insulating layer is a single layer comprising one of an organic Spin On Dielectrics (SOD) film, an organic Spin On Glass (SOG) film, an inorganic SOD film, an inorganic SOG film, and a high-heat-resistance organic polymer film resistant to a temperature of about 400° C. or higher.

6. The thin film transistor device according to claim 5, wherein the second upper insulating layer includes a silicon nitride film layer or a silicon oxynitride film layer.

7. An active matrix type display device comprising a thin film transistor device according to claim 5.

* * * * *